US010910743B2

(12) United States Patent
Lorenzo et al.

(10) Patent No.: US 10,910,743 B2
(45) Date of Patent: Feb. 2, 2021

(54) ELECTRICAL ASSEMBLY AND METHOD

(71) Applicant: Lear Corporation, Southfield, MI (US)

(72) Inventors: Antonio Palomo Lorenzo, Valls (ES);
Oscar Cano Salomo, Valls (ES)

(73) Assignee: Lear Corporation, Southfield, MI (US)

( * ) Notice: Subject to any disclaimer, the term of this patent is extended or adjusted under 35 U.S.C. 154(b) by 18 days.

(21) Appl. No.: 16/181,821

(22) Filed: Nov. 6, 2018

(65) Prior Publication Data

US 2020/0144745 A1    May 7, 2020

(51) Int. Cl.
| H05K 1/14 | (2006.01) |
| H01R 12/70 | (2011.01) |
| H01R 12/71 | (2011.01) |
| H01R 43/20 | (2006.01) |
| H01R 13/04 | (2006.01) |
| H01R 13/631 | (2006.01) |

(52) U.S. Cl.
CPC ....... *H01R 12/7011* (2013.01); *H01R 12/716* (2013.01); *H01R 13/04* (2013.01); *H01R 13/631* (2013.01); *H01R 43/205* (2013.01)

(58) Field of Classification Search
CPC ... H05K 5/0269; H05K 7/1409; G06F 1/1616
USPC ................. 361/737, 755, 679.01; 455/575.1
See application file for complete search history.

(56) References Cited

U.S. PATENT DOCUMENTS

| 4,541,034 A | 9/1985 | Fanning |
| 5,023,752 A | 6/1991 | Detter et al. |
| 5,647,757 A | 7/1997 | Chrysostomou |
| 6,254,407 B1 | 7/2001 | Burns |
| 6,992,248 B1 | 1/2006 | Dunbar et al. |
| 7,845,959 B2 | 12/2010 | Czyz et al. |
| 8,277,243 B1 | 10/2012 | Hernandez et al. |
| 8,323,046 B1 | 12/2012 | Daugherty et al. |
| 2008/0019502 A1* | 1/2008 | Emmert ................ H04M 1/026 379/433.07 |
| 2010/0258626 A1* | 10/2010 | Watanabe ........... H01M 2/1066 235/380 |
| 2016/0261070 A1 | 9/2016 | Hsu et al. |

FOREIGN PATENT DOCUMENTS

| CN | 104508913 A | 4/2015 |
| CN | 106063051 A | 10/2016 |
| CN | 106099449 A | 11/2016 |
| CN | 106887726 A | 6/2017 |
| JP | 2017135185 A | 8/2017 |
| KR | 20160092282 A | 8/2016 |

* cited by examiner

*Primary Examiner* — Phuong Chi Thi Nguyen
(74) *Attorney, Agent, or Firm* — Fishman Stewart PLLC

(57) ABSTRACT

An electrical assembly includes a first housing member, a second housing member, and/or a circuit board. The first housing member may be connected to the second housing member, and the second housing member may be configured to move to prevent removal of a connector from the circuit board. Movement of the second housing member relative to the first housing member may be restricted when the connector is improperly connected or only partially connected to the circuit board or the first housing member.

19 Claims, 10 Drawing Sheets

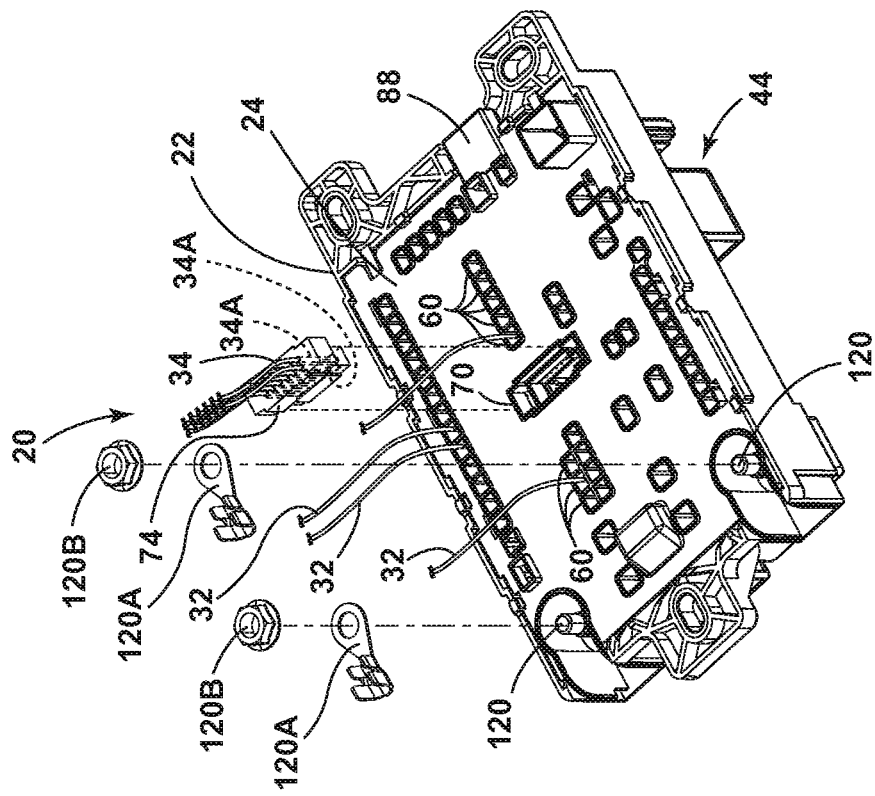
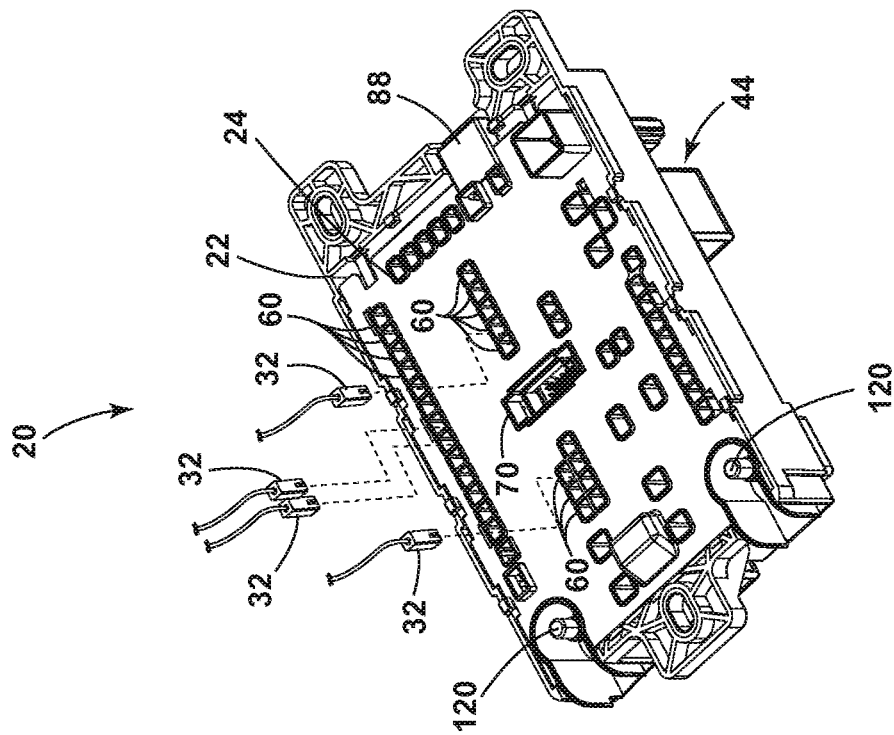
FIG. 5B
FIG. 5A

ELECTRICAL ASSEMBLY AND METHOD

TECHNICAL FIELD

The present disclosure generally relates to electrical assemblies, including electrical units that may include housing members that may be used in connection with circuit boards and wiring harness connectors.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies may be relatively complex and/or may not provide sufficient functionality. Some electrical assemblies may not be configured to provide terminal position assurance and/or locking functionalities.

There is a desire for solutions/options that minimize or eliminate one or more challenges or shortcomings of electrical assemblies. The foregoing discussion is intended only to illustrate examples of the present field and should not be taken as a disavowal of scope.

SUMMARY

In embodiments, an electrical assembly may include a first housing member, a second housing member, and/or a circuit board. The first housing member may be connected to the second housing member, and the second housing member may be configured to move to prevent removal of a connector from the circuit board. The second housing member may be substantially parallel to the circuit board. The second housing member may include a first position and/or a second position. The second housing member may be configured to move parallel to the circuit board between the first position and/or the second position. The first housing member may include an aperture, and/or the second housing member may include an aperture. The aperture of the first housing member and/or the aperture of the second housing member may be aligned when the second housing member is in the first position. The aperture of the first housing member and/or the aperture of the second housing member may be offset when the second housing member is in the second position. The second housing member may include a first position and/or a second position. The second housing member may be configured to restrict disconnection of the first housing member from the circuit board when the second housing member is in the second position.

With embodiments, the first housing member may include an engagement portion. The engagement portion may be engaged with (e.g., hooked on) the circuit board, and/or the engagement portion may be disposed in an aperture of the circuit board. A contact portion of the second housing member may be configured to restrict movement of the engagement portion when the second housing member is in the second position. The second housing member may include a first position and/or a second position. The first housing member may include a first aperture and/or a second aperture. The second housing member may include a first aperture and/or a second aperture. The first aperture of the first housing member may be aligned with the first aperture of the second housing member when the second housing member is in the first position. The second aperture of the first housing member may be at least partially offset from the second aperture of the second housing member when the second housing member is in the first position.

In embodiments, when the second housing member is in the second position, the first aperture of the first housing member may be at least partially offset with the first aperture of the second housing member, and/or the second aperture of the first housing member may be substantially aligned with the second aperture of the second housing member.

With embodiments, an electrical assembly may include a terminal. The terminal may include a body, a first connecting portion, and/or a second connecting portion. The first connecting portion and/or the second connecting portion may extend from the body. The body may include a first portion and/or a second portion. The body may be substantially L-shaped. The first connecting portion may be offset in a first direction and/or a second direction from the second connecting portion. The first connecting portion may extend substantially parallel to the first portion, and/or the second connecting portion may extend substantially perpendicular to the second portion.

With embodiments, the second housing member may include a tab. The tab may extend through and beyond an aperture of the first housing portion when the second housing member is in a second position (e.g., a locked position). The tab may not extend beyond the aperture when the second housing member is in a first position (e.g., an unlocked position). The tab extending beyond the aperture may provide a visual indication that the connector and/or a plurality of other connectors are properly connected to the circuit board and/or the first housing member. In embodiments, movement of the second housing member relative to the first housing member is restricted when the connector is improperly connected or only partially connected to the circuit board or the first housing member.

With embodiments, a method of assembling an electrical assembly may include providing a first housing member and/or a second housing member that may be connected to the first housing member; providing a circuit board that may be disposed within the first housing member and/or the second housing member; connecting a connector to the circuit board when the second housing member is in a first position; moving, if the connector is properly connected, the second housing member to a second position; and/or restricting, via the connector, movement of the second housing member into the second position if the connector is not properly connected. The method may include limiting, via the second housing member, disconnection of the first housing member from the circuit board when the second housing member is in the second position. The method may include providing a second connector; connecting the connector to the circuit board when second housing member is in the first position; moving the second housing member to the second position; and/or connecting the second connector to the circuit board when the second housing member is in the second position. Connecting the second connector with the circuit board may be restricted when the second housing member is in the first position. The connector and the second connector may be attached to respective wires.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

FIG. 5A is a perspective view generally illustrating an embodiment of an electrical assembly, with a second housing member in a first position, according to teachings of the present disclosure.

FIG. 5B is a perspective view generally illustrating an embodiment of an electrical assembly, with a second housing member in a second position, according to teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1A:
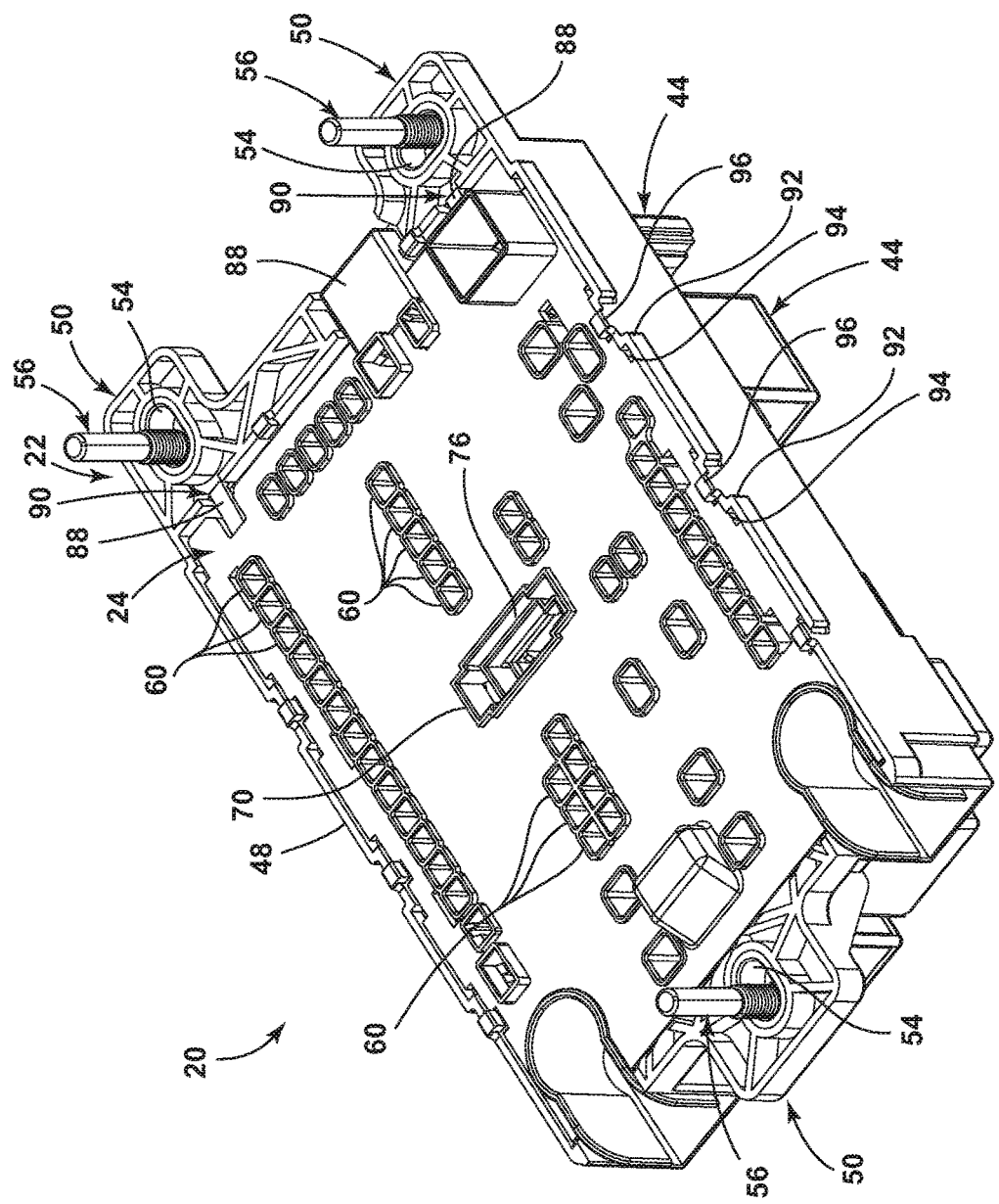
FIG. 1A is a perspective view generally illustrating an embodiment of an electrical assembly according to teachings of the present disclosure.
Figure 1B:
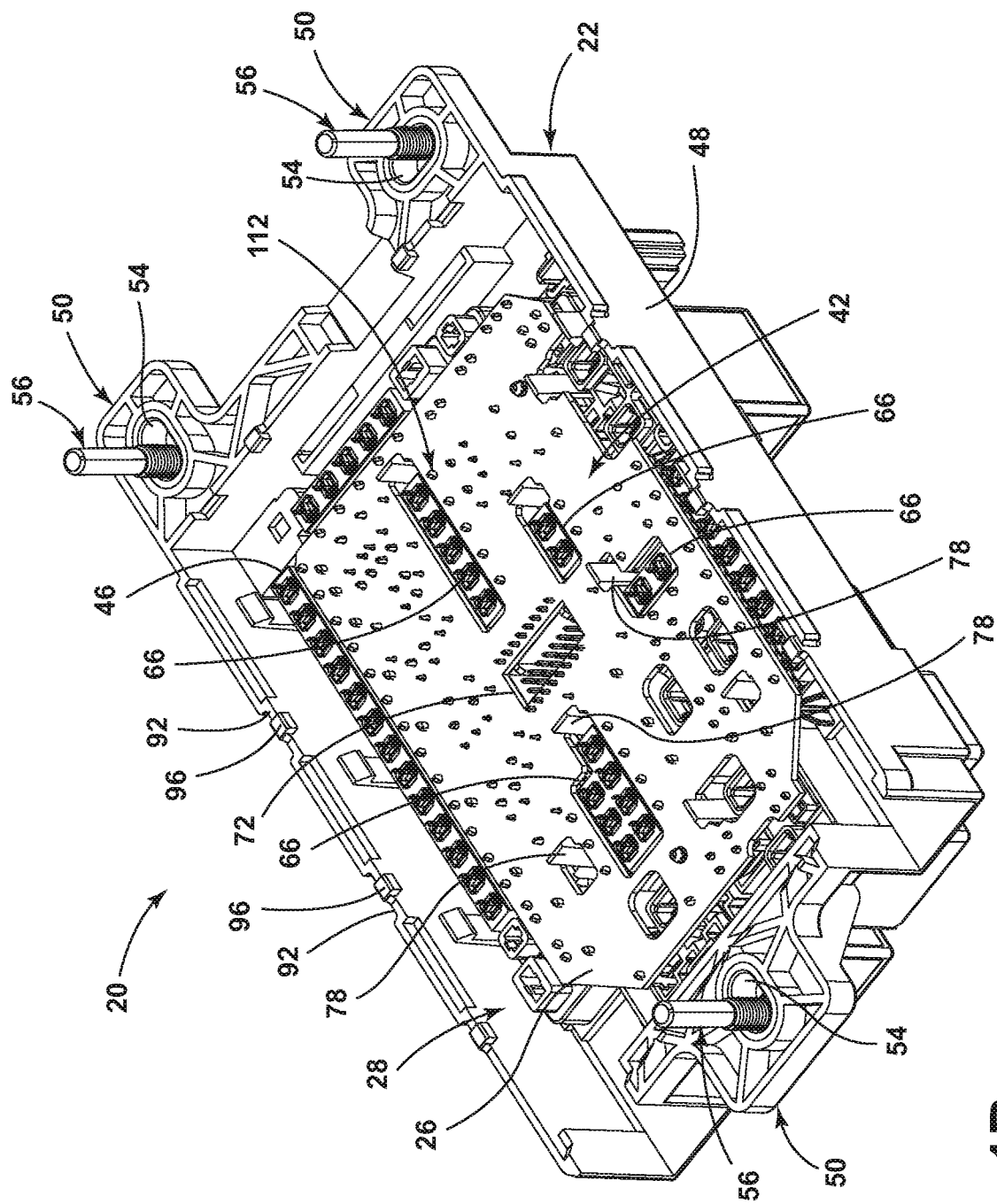
FIG. 1B is a perspective view generally illustrating portions of an embodiment of an electrical assembly according to teachings of the present disclosure.

In embodiments, such as generally illustrated in FIGS. 1A and 1B, an electrical assembly 20 may include a first housing member 22, a second housing member 24, and/or a circuit board 26. The first housing member 22 may be connected to the second housing member 24. The circuit board 26 may be disposed within a recess or chamber 28 defined by the first housing member 22 and/or the second housing member 24. One or more first connectors 32 and/or one or more second connectors 34 may be connected to the first housing member 22, the second housing member 24, the circuit board 26, and/or electrical components that may be connected thereto (see, e.g., FIGS. 5A and 5B). The first housing member 22 and/or the second housing member 24 may provide terminal position assurance (TPA) to ensure proper connection of and/or limit movement of one or more connectors 32, 34 relative to the first housing member 22, the second housing member 24, and/or a circuit board 26. The first housing member 22 and/or the second housing member 24 may be configured to selectively limit movement (e.g., in at least one direction) of connectors 32, 34 that may be electrically and/or mechanically connected to a circuit board 26.

With embodiments, the second housing member 24 may be removably and/or slidably connected to the first housing member 22. The second housing member 24 may be inserted into (or otherwise connected with) the first housing member 22, and/or in a connected/inserted configuration, the second housing member 24 may move (e.g., shift, translate, slide) relative to the first housing member 22. For example and without limitation, the second housing member 24 may move in an X-direction along the first housing member 22. The first housing member 22 and/or the second housing member 24 may be disposed substantially parallel to an X-Y plane. The second housing member 24 may move substantially in an X-Y plane and/or substantially parallel to the first housing member 22, such as between a first position (see, e.g., FIGS. 1A and 3A) and a second position (see, e.g., FIG. 3B).

With embodiments, such as generally illustrated in FIG. 1B, an electrical assembly 20 may include a circuit board 26. The circuit board 26 may be generally planar and/or may be disposed at least partially between the first housing member 22 and the second housing member 24. The first housing member 22 may be physically or mechanically connected to the second housing member 24 and/or the circuit board 26. The circuit board 26 may include one or more apertures 66 and/or one or more connector portions 72 that may facilitate electrical connections between the first housing member 22, the second housing member 24, the circuit board 26, the one or more connectors 32, 34, and/or one or more electrical components 44.

Figure 2:
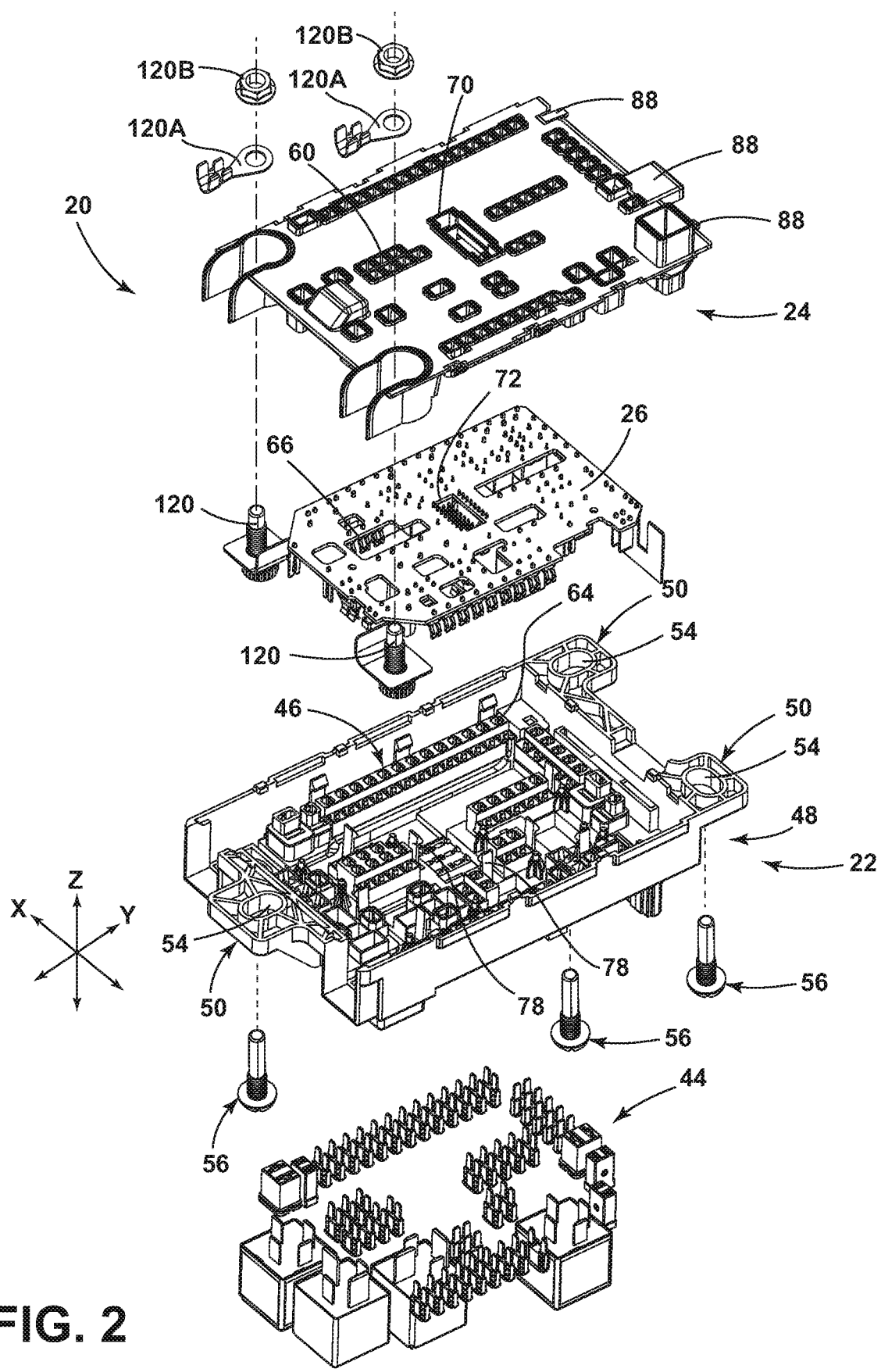
FIG. 2 is an exploded view generally illustrating an embodiment of an electrical assembly according to teachings of the present disclosure.

In embodiments, such as generally illustrated in FIGS. 1A, 1B, and 2, the first housing member 22 may include one or more of a variety of shapes, sizes, and/or configurations. For example and without limitation, the first housing member 22 may be generally rectangular. The one or more connectors 32, 34 may be configured for connection (e.g., electrical and/or mechanical connection) with one or more electronic components 44, and/or a first portion 46 (e.g., an inner portion) of the first housing member 22. The first housing member 22 may include a second portion 48 (e.g., an outer portion). The first portion 46 may be disposed at least partially within the second portion 48. The second portion 48 may provide a physical or mechanical connection with the second housing member 24.

With embodiments, the first housing member 22 may include one or more flanges 50 that may physically or mechanically connect the first housing member 22 to a mounting surface 52 (see, e.g., FIG. 3A), such as, for example, a surface of a vehicle. The one or more flanges 50 may extend outwardly from the second portion 48 of the first housing member 22. The one or more flanges 50 may include one or more mounting apertures 54. A respective fastener 56 (e.g., bolt, screw, etc.) may be at least partially inserted in the one or more mounting apertures 54 to connect the first housing member 22 and/or the electrical assembly 20 to a mounting surface 52.

Figure 3A:
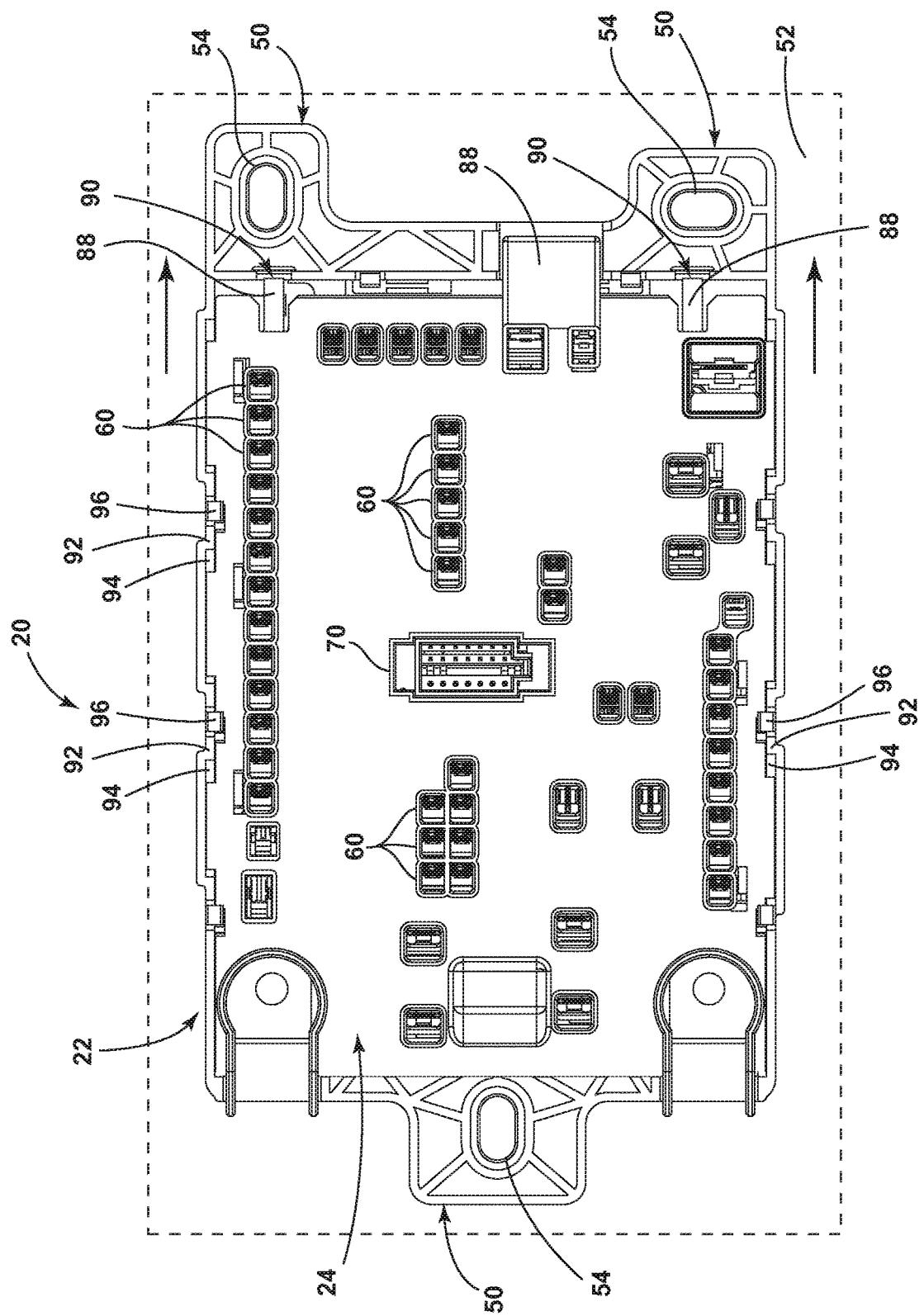
FIG. 3A is a top view generally illustrating an embodiment of an electrical assembly, with a second housing member in a first position, according to teachings of the present disclosure.
Figure 3B:
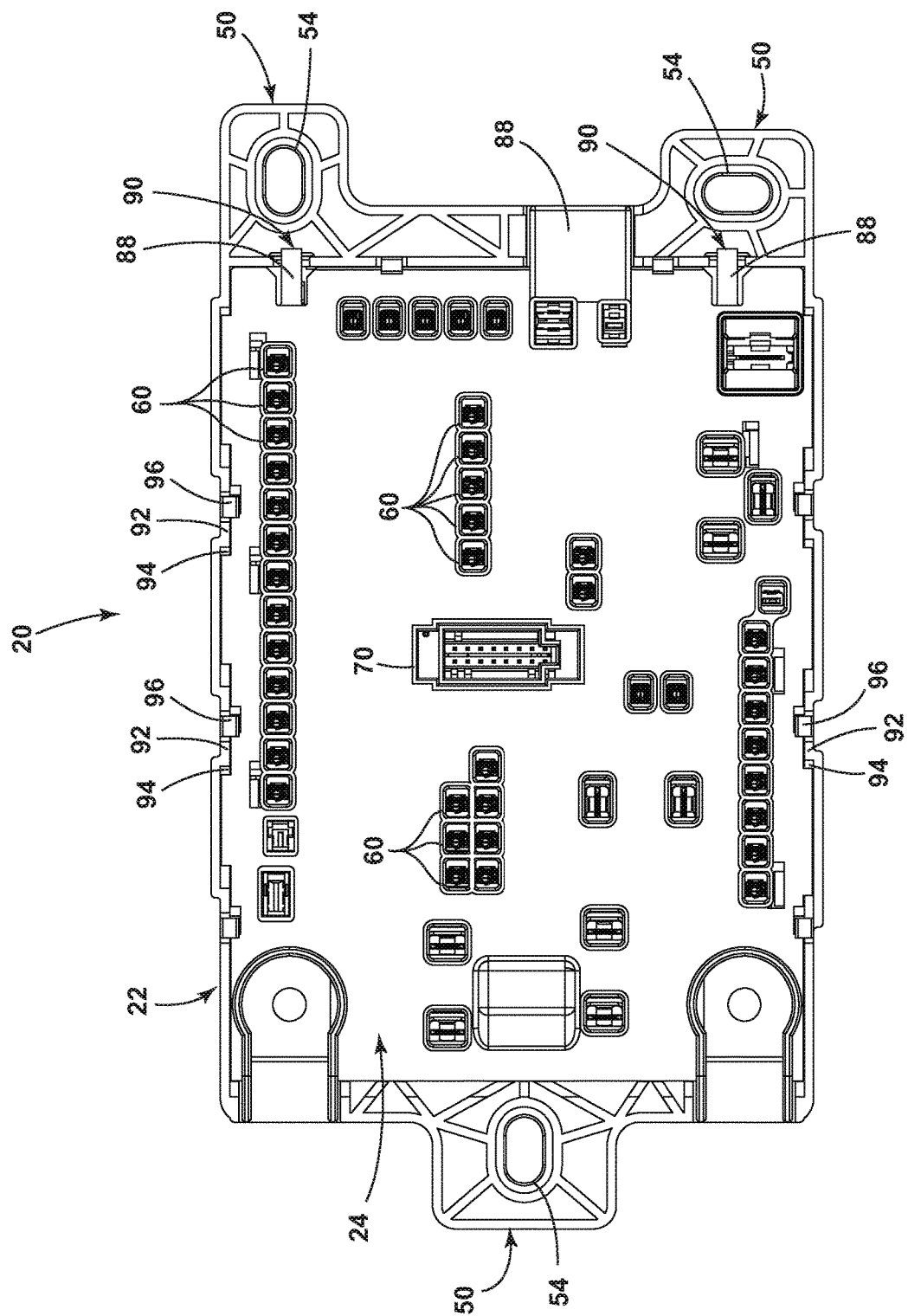
FIG. 3B is a top view generally illustrating an embodiment of an electrical assembly, with a second housing member in a second position, according to teachings of the present disclosure.

In embodiments, such as those generally illustrated in FIGS. 1A, 3A, and 3B, an electrical assembly 20 may include a second housing member 24. The second housing member 24 may include one or more of a variety of shapes, sizes, and/or configurations. For example and without limitation, the second housing member 24 may be generally rectangular and/or planar. A shape of the second housing member 24 may generally correspond to a shape of the first housing member 22. The second housing member 24 may include one or more apertures, such as one or more first apertures 60, and/or one or more connector portions 70 that may be configured as recesses and/or apertures. The one or more apertures 60 or connector portions 70 may be configured to receive at least a portion of one or more connectors 32, 34, respectively. The one or more apertures 60 or connector portions 70 may be configured to physically or mechanically guide the one or more connectors 32, 34 to connect with the first housing member 22, the circuit board 26 and/or with the electrical components 44 that may be connected to the first housing member 22. Once inserted, movement of the one or more connectors 32, 34 may be limited in at least one direction (e.g., in the X-direction, the Y-direction, and/or the Z-direction), such as via second housing member 24.

Figure 4B:
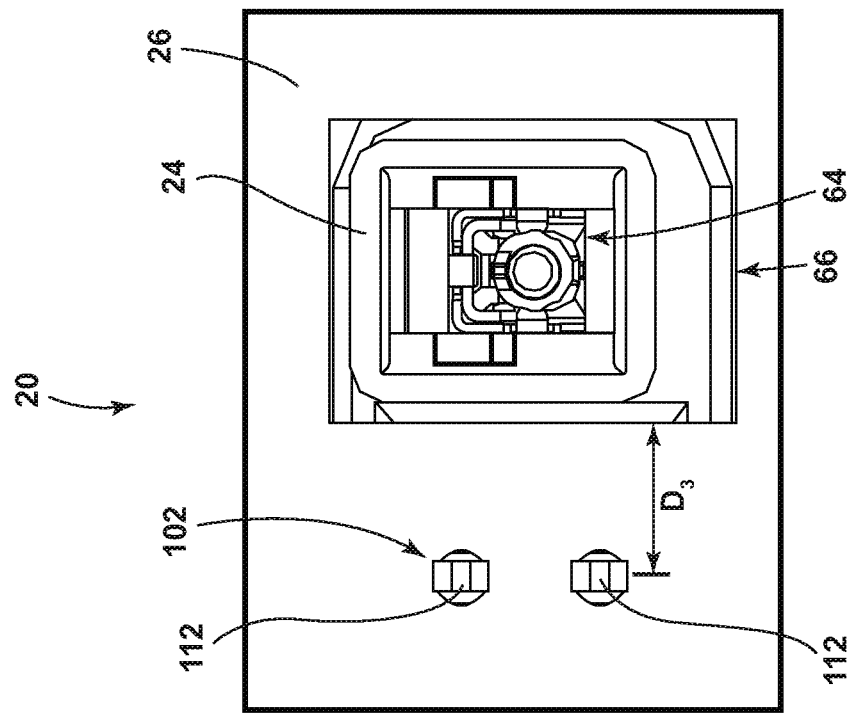
FIG. 4B is a cross-sectional view generally illustrating portions of an embodiment of an electrical assembly, with a second housing member in a second position, according to teachings of the present disclosure.

With embodiments, the second housing member 24 may include a first position and/or a second position. The first position may correspond to an unlocked position of the electrical assembly 20 (see, e.g., FIGS. 3A, 4A, and 5A), and/or the second position may correspond to a locked position of the electrical assembly 20 (see, e.g., FIGS. 3B, 4B, and 5B). The second housing member 24 may move, translate, or slide (e.g., in the X-direction) between the first position and the second position. The first housing member 22 may include one or more first apertures 64, the circuit board 26 may include one or more first apertures 66, and/or the second housing member may include one or more first apertures 60. As generally illustrated in FIG. 5A, in the first position, the second housing member 24 may restrict and/or prevent connection of one or more terminal posts 120 (e.g., over-molded screws), terminal rings 120A and/or nuts 120B that may be configured for connection with wires/cables, such as battery cables. As generally illustrated in FIG. 5B, in the second position, the second housing member 24 may not substantially restrict connection of the battery cables, terminal rings 120A, and/or nuts 120B to the terminal posts 120. The terminal posts 120 may be connected to and/or formed with the first housing member 22.

Figure 4A:
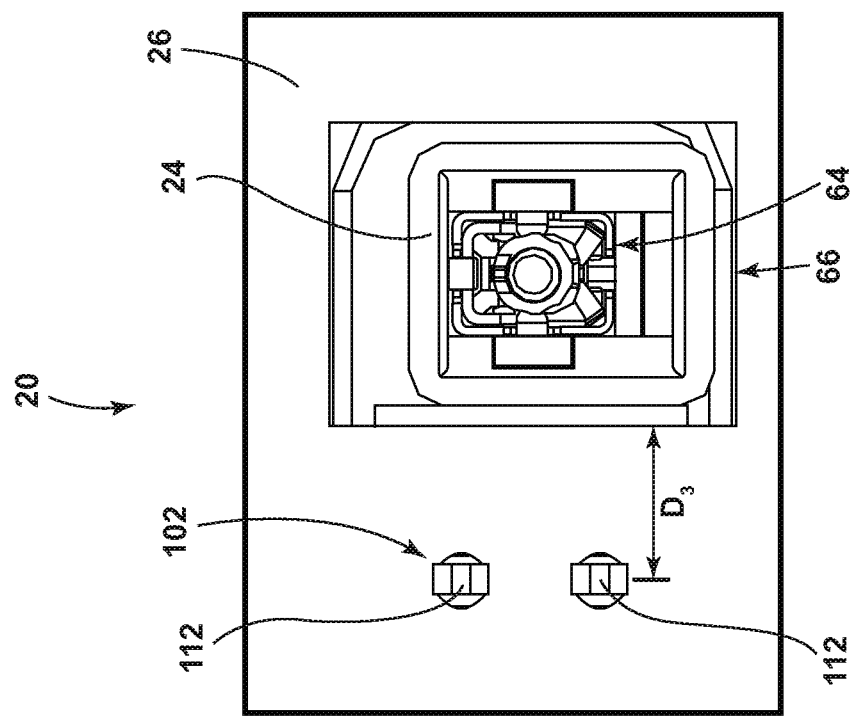
FIG. 4A is a cross-sectional view generally illustrating portions of an embodiment of an electrical assembly, with a second housing member in a first position, according to teachings of the present disclosure.

In embodiments, the first apertures 60, 64, 66 of the second housing member 24, the first housing member 22, and/or the circuit board 26 may be substantially and/or completely operably aligned with each other (e.g., in an X-direction and/or a Y-direction) when the second housing member 24 is in the first position (see, e.g., FIG. 4A). When the second housing member 24 is in the first position (and first apertures 60, 64, 66 are aligned), one or more first connectors 32 may be inserted into the respective first apertures 60 of the second housing member 24, first apertures 66 of the circuit board 26, and/or first apertures 64 of the first housing member 22. A first connector 32 may be inserted such that the first connector 32 may mechanically connect to the first housing member 22 and/or the second housing member 24. A first connector 32 may electrically connect to the circuit board 26 and/or an electrical component 44 (e.g., a fuse may be disposed within and/or connected to the first housing member 22).

In embodiments, movement of the second housing member 24 relative to the first housing member 22 may be limited in at least some circumstances. For example and without limitation, if at least one first connector 32 is not properly connected with the first housing member 22, the circuit board 26, and/or a respective electrical component 44, a portion of that first connector 32 may still be disposed in a respective first aperture 60 of the second housing member, which may restrict movement (e.g., translating or sliding movement) of the second housing member 24. When all the first connectors 32 are sufficiently/properly connected (e.g., when the first connectors 32 are inserted completely through the second housing member 24), the second housing member 24 may be moved from the first position to the second position. Restricted movement of the second housing member 24 from the first position to the second position may, among othering things, provide an indication (e.g., a tactile and/or visual indication), such as to an operator that may be assembling or modifying the electrical assembly 20, that not all of the first connectors 32 (and any terminals associated therewith) are properly connected. In embodiments, one or more tabs 88 may one or more different colors relative to the first housing member 22, which may further facilitate visual indication of connection information or status.

With embodiments, if the second housing member 24 moves from the first position along the first housing member 22 to the second position, the second housing member 24 may lock some or all of the one or more first connectors 32 in place. The first apertures 60, 64, 66 of the first housing member 22, the circuit board 26, and/or the second housing member 24 may not be substantially and/or completely aligned with each other (e.g., in an X-direction and/or a Y-direction) when the second housing member 24 is in the second position (see, e.g., FIG. 4B). Additionally or alternatively, the first apertures 60 of the second housing member 24 may not be aligned with the inserted first connectors 32, which may limit or prohibit movement of the first connectors 32, such as in a Z-direction. For example, and without limitation, the second housing member 24 may limit and/or prevent removal/disconnection of the first connector(s) 32 from the first housing member 22, the circuit board 26, and/or the electrical components 44 when the second housing member 24 is in the second position. In embodiments, limiting Z-direction movement of the first connectors 32 may serve to maintain (e.g., protect, preserve, etc.) connection between the first connectors 32, the circuit board 26, and/or respective electrical components 44.

In embodiments, such as generally illustrated in FIG. 5B, an electrical assembly 20 may include a second connector 34. The second housing member 24 and/or the circuit board 26 may include a connector portion 70, 72, respectively. The second connector 34 may be configured for connection with and/or insertion into the connector portion 70 of the second housing member 24 and/or the connector portion 72 of the circuit board 26. When the second housing member 24 is in the first position, the connector portion 70 of the second housing member 24 may not be substantially and/or completely aligned (e.g., in the X-direction and/or Y-direction) with the connector portion 72 of the circuit board 26, which may prevent connection of the second connector 34 and may provide an indication that the second housing member 24 is not in the second position. Connector portion 72 of the circuit board 26 may include a corresponding connector that may be soldered to the circuit board 26 and may be configured for mating/connection with the second connector 34.

With embodiments, the second connector 34 may be connected to the first housing member 22, the second housing member 24, the circuit board 26, and/or one or more electrical components 44. Connection of the second connector 34 to the first housing member 22, the second housing member 24, and/or the circuit board 26 may limit movement of the second housing member 24. For example and without limitation, in a connected position, the second connector 34 may restrict movement (e.g., in the X-direction and/or Y-direction) of the second housing member 24 such that the second housing member 24 may not move from the second position (e.g., locked position) to the first position (e.g., unlocked position). When the second housing member 24 is in the second position, the second connector 34 may be aligned with the connector portion 72 of the circuit board 26 and/or the connector portion 70 of the second housing member 24. The connector portion 70 may cooperate with the outer surface 74 of the second connector 34, such as to mechanically lock the second connector 34 in place. An outer surface 74 of the second connector 34 may contact the inner surface 76 of the connector portion 70 of the second housing member 24, which limits movement of the second housing member 24. With embodiments, the second connector 34 may include a plurality of terminals 34A, such as, for example and without limitation, about 10 terminals, about 20 terminals, about 30 terminals, or more or fewer terminals.

Figure 6B:
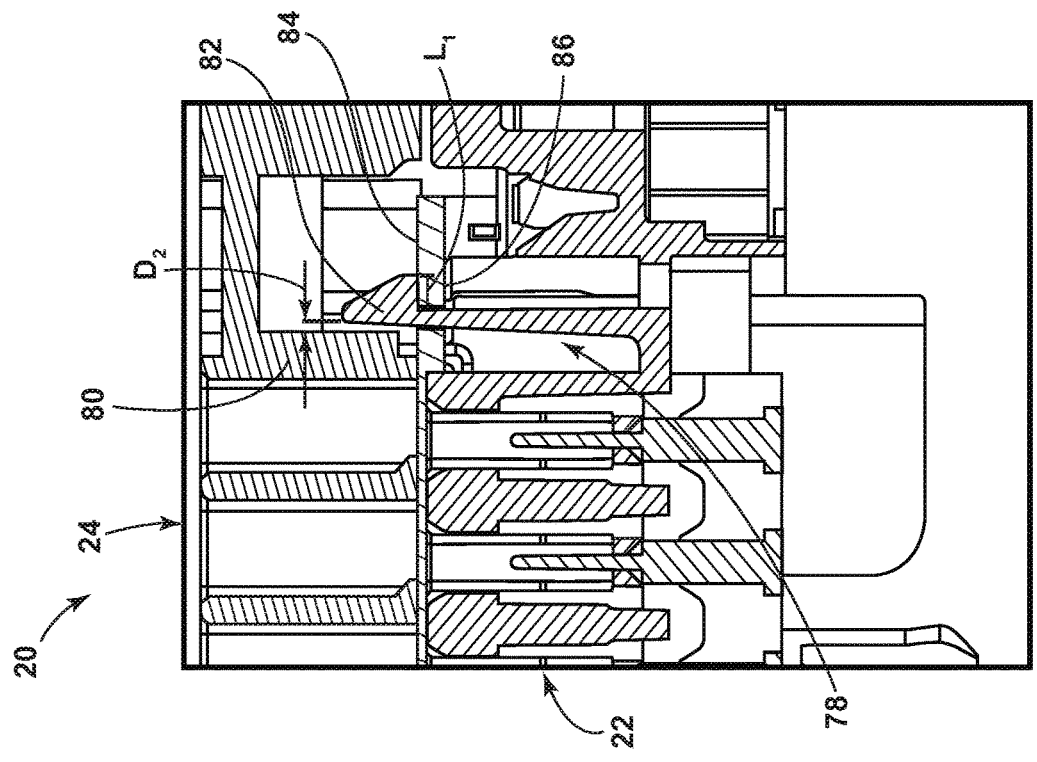
FIG. 6B is a section view generally illustrating portions of an embodiment of an electrical assembly, with a second housing member in a second position, according to teachings of the present disclosure.
Figure 6A:
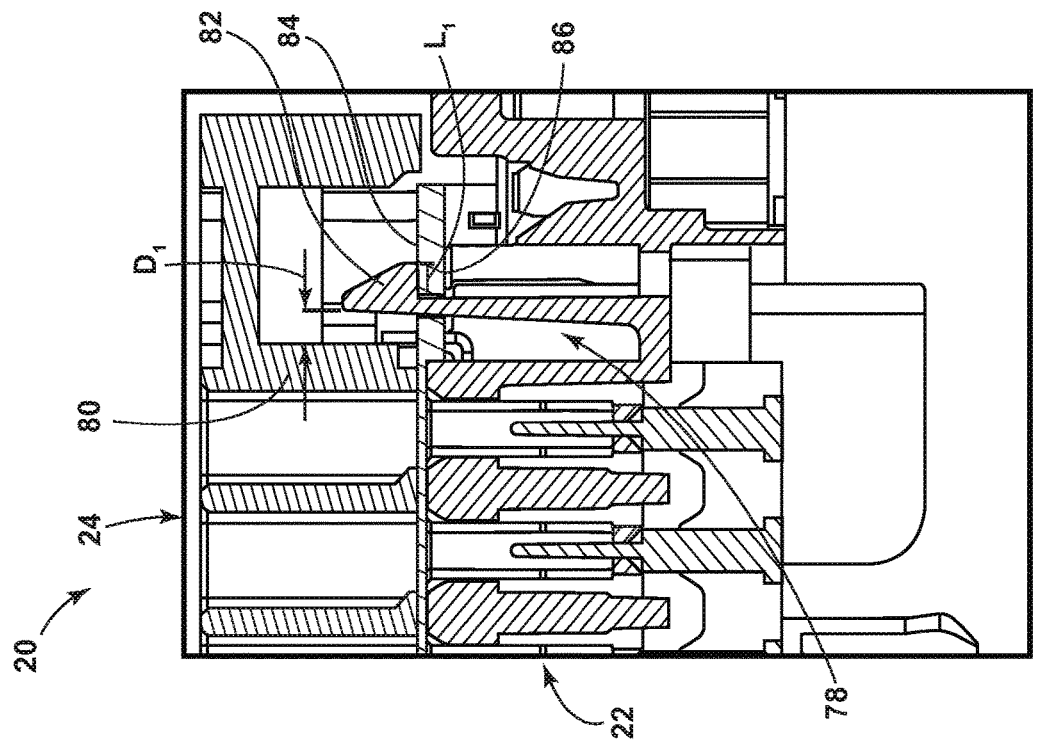
FIG. 6A is a section view generally illustrating portions of an embodiment of an electrical assembly, with a second housing member in a first position, according to teachings of the present disclosure.

In embodiments, such as generally shown in FIGS. 6A and 6B, a first housing member 22 may include an engagement portion 78. The engagement portion 78 may extend from the first portion 46 of the first housing member 22, through the first aperture 66 of the circuit board 26, and/or into the second housing member 24. An engagement portion 78 may include one or more of a variety of shapes, sizes, and/or configurations. For example and without limitation, the engagement portion 78 may be configured as a latch that may be hook-shaped. The engagement portion 78 may include an end portion 82 that may be substantially triangular. The end portion 82 may contact a surface of the circuit board 26. The engagement portion 78 may hook onto a first surface 84 (e.g., a top surface) of the circuit board 26 and/or may limit movement (e.g., in the Z-direction) between the first housing member 22 and the circuit board 26. The circuit board 26 may include a second surface 86 (e.g., a bottom surface) that be disposed opposite the first surface 84 and that may not contact the engagement portion 78. In embodiments, such as generally shown in FIG. 1B, the electrical assembly 20 may include a plurality of engagement portions 78 that may be perpendicular to each other (e.g., one or more engagement portions 78 may be substantially parallel to the X-direction, and one or more engagement portions 78 may be substantially parallel to the Y-direction). The engagement portion(s) 78 may initially deflect upon insertion into an aperture 42 of the circuit board 26 and may latch with the circuit board 26 once the end portion 82 clears the first surface 84 of the circuit board 26. An aperture 42 may, with embodiments, be combined with and/or coincident with an aperture 66.

In embodiments, a second housing member 24 may include a contact portion 80 that may selectively limit movement of the end portion 82 of the engagement portion 78 in at least one direction. The contact portion 80 may be disposed proximate the top surface 84 of the circuit board 26 (e.g., the contact portion 80 may contact the top surface 84 of the circuit board 26 and/or be disposed above the top surface 84 of the circuit board 26). When the second housing member 24 is in the first position, the contact portion 80 may not materially limit movement of the end portion 82 such that the engagement portion 78 may disconnect from the circuit board 26 (see, e.g., FIG. 6A). When the second housing member 24 is in the second position, the contact portion 80 may limit movement of the end portion 82 such that the engagement portion 78 may not disconnect from the circuit board 26 (see, e.g., FIG. 6B).

In embodiments, the end portion 82 of the engagement portion 78 may overlap and/or contact the top surface 84 of the circuit board 26. The end portion 82 may include a first length $L_1$ that may contact the top surface 84 of the circuit board 26. When the second housing member 24 is in the first position, the contact portion 80 may be disposed at a first distance $D_1$ from the engagement portion 78. The first length $L_1$ may be less than the first distance $D_1$ such that the engagement portion 78 may be removed from the circuit board 26 (e.g., the end portion 82 may not be disposed in an aperture 42 of the circuit board 26). When the second housing member 24 is in the second position, the contact portion 80 may be disposed at a second distance $D_2$ from the engagement portion 78. The first length $L_1$ may be greater than the second distance $D_2$ such that the contact portion 80 may limit and/or prevent removal of the engagement portion 78 from the circuit board 26. In some circumstances, when the second housing member 24 is in the second position, the engagement portion 78 may move out of complete engagement with the circuit board 26, but the contact portion 80 may prevent complete disengagement of the engagement portion 78 from the circuit board 26 (e.g., the contact portion 80 may not always be in contact with the engagement portion 78).

Figure 7:
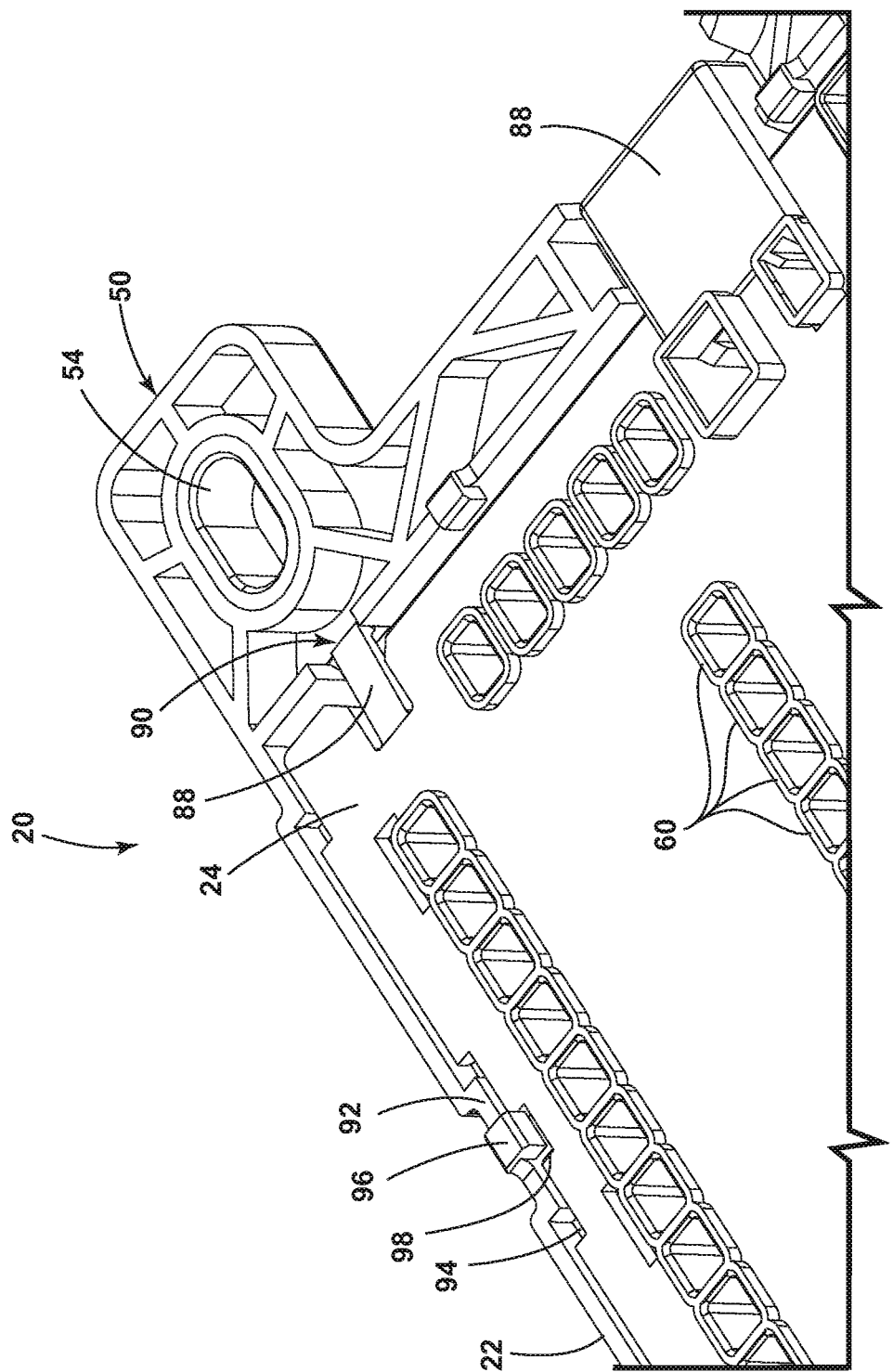
FIG. 7 is a perspective view generally illustrating portions of an embodiment of a second housing member including a tab according to teachings of the present disclosure.

In embodiments, such as generally illustrated in FIGS. 1A and 7, the second housing member 24 may include one or more tabs 88. The one or more tabs 88 may be disposed about a periphery of the second housing member 24. The tabs 88 may include one or more of a variety of shapes, sizes, and/or configurations. For example, the tabs 88 may be generally planar and/or rectangular. The first housing member 22 may include one or more tab recesses 90 that may be aligned (e.g., in the X-direction, Y-direction, and/or Z-direction) with the one or more tabs 88. When the second housing member 24 is in the first position, the tabs 88 may be disposed inward of the tab recesses 90 or partially in the tab recesses 90, and may not extend beyond the tab recesses 90. When the second housing member 24 is in the second position, the tabs 88 may be further disposed in the tab recesses 90 and may extend completely through and beyond the tab recesses 90. The one or more tabs 88 extending beyond the one or more tab recesses 90 may provide an indication that the second housing member 24 is in the second position and that all of the first connectors 32 are properly connected. One or more tabs 88 may be configured to latch with the first housing member 22, such as to lock the second housing member 24 relative to the first housing member 22.

With embodiments, such as generally illustrated in FIGS. 1A, 3A, 3B, 4A, 4B, and 7, the first housing member 22 may include one or more formations 92 and/or the second housing member 24 may include one or more formation recesses 94. The formations 92 and/or formation recesses 94 may include a variety of shapes, sizes, and/or configurations. For example and without limitation, the formations 92 and/or formation recesses 94 may be substantially rectangular. The shape of the formations 92 may correspond to the shape of the formation recesses 94. The one or more formations 92 may be disposed about a periphery of an inner surface of the second portion 48 of the first housing member 22. The formation recesses 94 may be disposed about a periphery of the second housing member 24. The one or more formations 92 may engage one or more formation recesses 94 of the second housing member 24 such as to limit maximum movement of the second housing member 24 relative to the first housing member 22.

With embodiments, the first housing member 22 and/or the second housing member 24 may include corresponding protrusions 96 and protrusion recesses 98, respectively, that may be configured to facilitate alignment of the second housing member 24 as the first housing member 22 and the second housing member 24 are initially connected. In a connected configuration of the second housing member 24 with the first housing member 22, the protrusions 96 may be disposed above the second housing member 24 such that the protrusions 96 may not affect movement in the X-Y direction of the second housing member 24 relative to the first housing member 22. When the second housing member 24 is in the second position, the protrusions 96 may not be aligned with the protrusion recesses 98 (e.g., in the Z-direction) and the protrusions 96 may restrict and/or prevent movement of the second housing member 24 away from the first housing member 22 in the Z-direction.

Figure 8B:
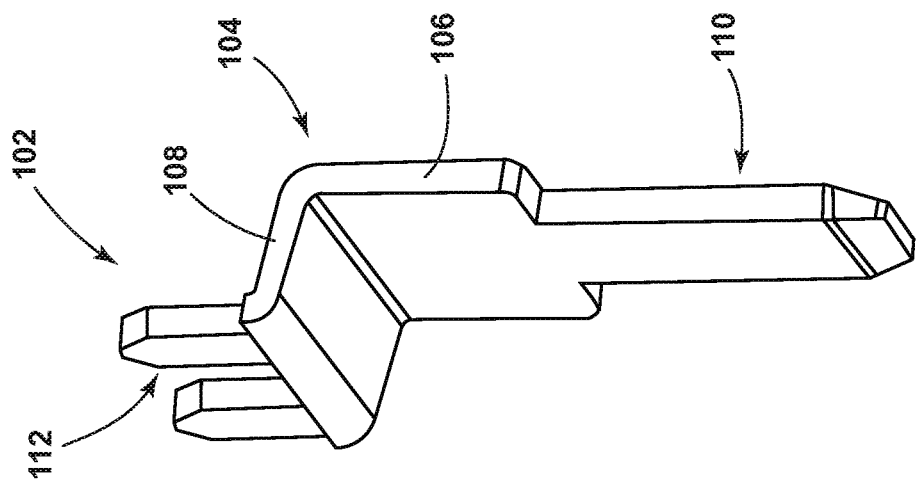
FIG. 8B is a perspective view generally illustrating embodiments of a terminal according to teachings of the present disclosure.
Figure 8A:
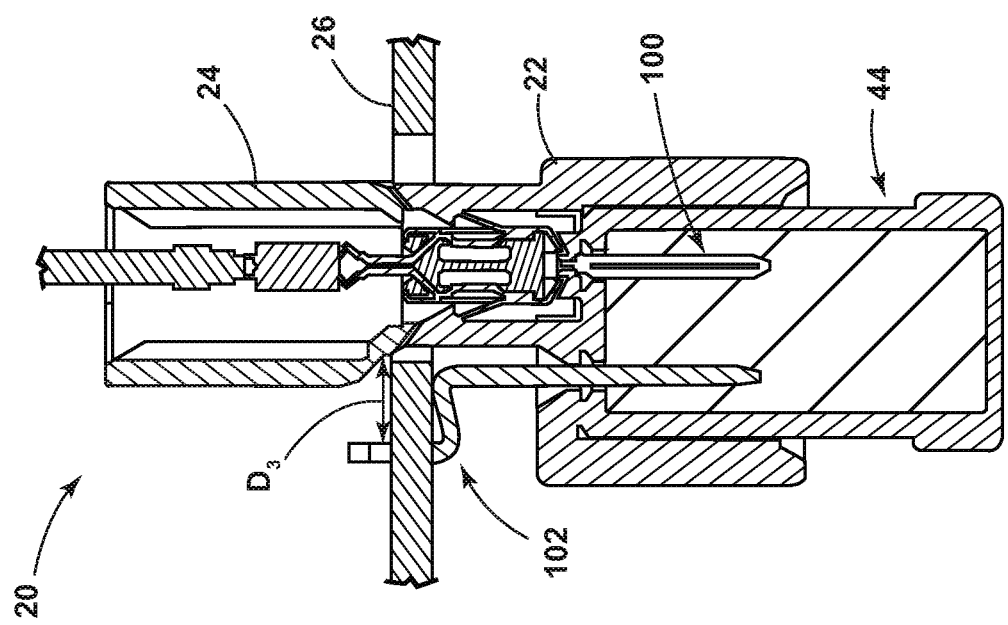
FIG. 8A is a cross-sectional view generally illustrating portions of embodiments of a first housing member, a second housing member, a circuit board, an electrical component, and a terminal according to teachings of the present disclosure.

In embodiments, such as generally illustrated in FIGS. 8A and 8B, electrical components 44 may be at least partially aligned with the first apertures 66 of the circuit board, such as to facilitate connection of the electrical components 44 with respective first connectors 32. An electrical component 44 may be connected to a first connector via a first terminal 100. With embodiments, one or more electrical components 44 may be connected, directly or indirectly, to the circuit board 26. For example and without limitation, one or more electrical terminals may connect an electrical component 44 with the circuit board 26. It may be desirable for a terminal 102 connecting an electrical component 44 to the circuit board 26 to be offset from an aperture 66 of the circuit board 26, such as to ensure sufficient structural support. In some instances, electrical components 44 may not be sufficiently wide to accommodate planar/straight terminals spaced far enough apart for such an offset.

In embodiments, the first terminal 100 may be generally planar/straight and the second terminal 102 may include an offset configuration. For example and without limitation, the second terminal 102 may include a body 104 having a first portion 106 and/or a second portion 108. The first portion 106 and/or the second portion 108 may form an L-shape. The first portion 106 may be substantially perpendicular to the second portion 108. The second terminal 102 may include a first connecting portion 110 that may extend substantially parallel to the first portion 106 and/or a second connecting portion 112 that may extend substantially perpendicular to the second portion 108. The second terminal 102 may, for example and without limitation, be generally S-shaped. The first connecting portion 110 may be offset (e.g., in the X-direction or the Y-direction) from the second connecting portion 112. The first connecting portion 110 may be offset from the second connecting portion 112 such that the second terminal 102 may connect to the circuit board 26 at a distance $D_3$ from an aperture 42 of the circuit board 26. With embodiments, electrical components 44 of different sizes may be connected to the circuit board 26 via the second terminals 102. For example, the general S-shape of the second terminal 102 may permit the use of smaller electrical components 44 without compromising the mechanical and/or electrical connection between the second terminal 102, the electrical component 44, the circuit board 26, the first housing member 22, and/or the second housing member 24.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

What is claimed is:

1. An electrical assembly, comprising:
a first housing member;
a second housing member; and
a circuit board;
wherein the first housing member is connected to the second housing member, and the second housing member is configured to move to restrict removal of a connector from the circuit board and/or the first housing member;
wherein the second housing member has a first position and a second position;
wherein the first housing member includes an aperture and the second housing member includes an aperture; and the aperture of the first housing member and the aperture of the second housing member are aligned when the second housing member is in the first position; and
wherein the aperture of the first housing member and the aperture of the second housing member are offset when the second housing member is in the second position.

2. The electrical assembly of claim 1, wherein the second housing member is substantially parallel to the circuit board.

3. The electrical assembly of claim 1, wherein the second housing member is configured to restrict disconnection of the first housing member from the circuit board when the second housing member is in the second position.

4. The electrical assembly of claim 1, wherein the second housing member includes a tab; the tab extends through and beyond an aperture of the first housing member when the second housing member is in the second position; the tab does not extend beyond the aperture when the second housing member is in the first position; and the tab extending beyond the aperture provides a visual indication that the connector and a plurality of other connectors are properly connected to the circuit board and/or the first housing member.

5. The electrical assembly of claim 1, wherein movement of the second housing member relative to the first housing member is restricted when the connector is improperly connected or only partially connected to the circuit board or the first housing member.

6. The electrical assembly of claim 1, wherein the second housing member is configured to move to restrict removal of said connector and one or more additional connectors;
said connector is fixed to a wire; and each of said one or more additional connectors is fixed to a respective wire.

7. An electrical assembly, comprising:
a first housing member;
a second housing member; and
a circuit board;
wherein the first housing member is connected to the second housing member, and the second housing member is configured to move to restrict removal of a connector from the circuit board and/or the first housing member;
wherein the second housing member has a first position and a second position; and the second housing member is configured to restrict disconnection of the first housing member from the circuit board when the second housing member is in the second position; and
wherein the first housing member includes an engagement portion, and the engagement portion is disposed in an aperture of the circuit board.

8. The electrical assembly of claim 7, wherein a contact portion of the second housing member is configured to restrict movement of the engagement portion when the second housing member is in the second position.

9. The electrical assembly of claim 7, wherein said connector is fixed to a wire.

10. An electrical assembly, comprising:
a first housing member;
a second housing member; and
a circuit board;
wherein the first housing member is connected to the second housing member, and the second housing member is configured to move to restrict removal of a connector from the circuit board and/or the first housing member;
wherein the electrical assembly including a terminal; the terminal includes a body, a first connecting portion, and a second connecting portion; and the first connecting portion and the second connecting portion extend from the body;
wherein the body includes a first portion and a second portion, the body is substantially L-shaped; the first connecting portion is offset in a first direction from the second connecting portion; and the first connecting portion extends substantially parallel to the first portion; and the second connecting portion extends substantially perpendicular to the second portion.

11. The electrical assembly of claim 10, wherein the second housing member includes an aperture and a connector portion; the aperture is configured to receive the connector; and the connector portion is configured to receive a second connector; when the connector is not sufficiently connected to the first housing member and/or the circuit board, the connector restricts movement of the second housing member from a first position to a second position; and when the second connector is connected to the first housing member and/or the circuit board, the second connector restricts movement of the second housing member from the second position to the first position.

12. The electrical assembly of claim 10, wherein said connector is fixed to a wire.

13. The electrical assembly of claim 10, wherein the first housing member and the second housing member are configured such that if said connector is not properly connected with the first housing member, the circuit board, or an electrical component, said connector restricts movement of the second housing member to provide a tactile and visual indication that said connector is not properly connected.

14. The electrical assembly of claim 10, wherein the second housing member has a first position and a second position; the first housing member includes a first aperture and a second aperture; the second housing member includes a first aperture and a second aperture; the first aperture of the first housing member is aligned with the first aperture of the second housing member when the second housing member is in the first position; and the second aperture of the first housing member is at least partially offset from the second aperture of the second housing member when the second housing member is in the first position.

15. The electrical assembly of claim 14, wherein when the second housing member is in the second position, the first aperture of the first housing member is at least partially offset with the first aperture of the second housing member; and the second aperture of the first housing member is aligned with the second aperture of the second housing member.

16. The electrical assembly of claim 10, wherein the second housing member has a first position and a second position.

17. The electrical assembly of claim 16, wherein the second housing member is configured to move parallel to the circuit board between the first position and the second position.

18. The electrical assembly of claim 16, wherein the first housing member includes an aperture and the second housing member includes an aperture; and the aperture of the first housing member and the aperture of the second housing member are aligned when the second housing member is in the first position.

19. The electrical assembly of claim 18, wherein the aperture of the first housing member and the aperture of the second housing member are offset when the second housing member is in the second position.

\* \* \* \* \*